United States Patent [19]

Troy

[11] 3,982,139

[45] Sept. 21, 1976

[54] EXPONENTIAL SWEEP MULTIVIBRATOR

[76] Inventor: Stephen R. Troy, 104-20 89th Ave., Richmond Hill, N.Y. 11418

[22] Filed: Apr. 21, 1975

[21] Appl. No.: 570,064

[52] U.S. Cl. .............................. 307/228; 328/181; 328/142; 307/229
[51] Int. Cl.² .................................... H03K 4/08
[58] Field of Search .......................... 307/228, 229; 328/181–185, 142

[56] References Cited
UNITED STATES PATENTS

| | | | |
|---|---|---|---|
| 3,210,558 | 10/1965 | Owen | 307/228 |
| 3,569,842 | 3/1971 | Schroyer | 307/228 |
| 3,588,543 | 6/1971 | Schwartz | 307/228 |
| 3,676,697 | 7/1972 | Davenport | 307/228 |

Primary Examiner—Stanley D. Miller, Jr.
Attorney, Agent, or Firm—Joseph E. Rusz; Jacob N. Erlich

[57] ABSTRACT

An exponential sweep multivibrator capable of extremely high-speed operation and producing an exponential output waveform. This multivibrator in addition to incorporating within the circuitry thereof a "digital" device such as a NAND gate, integrates the collector current from a controlled source transistor in a capacitor. The collector current is proportional to the output voltage of the digital gate, which in turn is proportional to the sum of the input current and a current derived from the output voltage of the multivibrator. As a result thereof an output waveshape is produced whose rate of increase is proportional to its instantaneous amplitude, which, by definition, is an exponential function of time.

11 Claims, 2 Drawing Figures

EXPONENTIAL SWEEP MULTIVIBRATOR

STATEMENT OF GOVERNMENT INTEREST

The invention described herein may be manufactured and used by or for the Government for governmental purposes without the payment of any royalty thereon.

BACKGROUND OF THE INVENTION

This invention relates generally to multivibrators, and, more particularly, to a voltage-controlled sweep multivibrator which produces an output waveshape which is an essentially exponential function with respect to time.

A multivibrator is a form of relaxation oscillator consisting normally of two or more active devices, such as transistors or vacuum tubes, interconnected by electric networks. In a multivibrator a portion of the output voltage or current of each active device is applied to the input of the other with such magnitude and polarity as to maintain the devices alternately conducting over controllable periods of time. Such an electronic circuit has an extremely broad range of applications, in such equipment as oscilloscopes, telemetry systems, computer terminals, television cameras and signal processors, electronic music systems, etc.

In the past, multivibrators had an extremely limited range of sweep repetition rates (SRR). This problem was overcome by the utilization of a digital device and associated circuitry in patent application Ser. No. 542,639, filed Jan. 20, 1975 by the inventor of the instant application. Although the multivibrator of Ser. No. 542,639 was a versatile multivibrator circuit, capable of being turned on and off or synchronized by external pulses, and having its repetition rate controlled by an external voltage, the output waveshape of the above multivibrator was a highly linear voltage sweep. In other words, the voltage starts near zero, increases linearly with time, reaches a peak value, decreases almost instantaneously to its starting time, and then begins again. Although such a particular waveshape is useful for a number of purposes it fails to provide the exponential output waveshape necessary in instruments such as sweep generators, allowing an oscilloscope display of the frequency response of a device under test, with a logarithmic scale for the frequency axis.

Previous exponential sweep multivibrators used the exponential properties of a diode or transistor. Unfortunately, devices that display this property accurately over a wide range of inputs are not only extremely expensive to manufacture, but also produce an exponential property which varies significantly with temperature.

SUMMARY OF THE INVENTION

The instant invention overcomes the problems set forth in detail hereinabove by providing an exponential sweep multivibrator which is not only inexpensive to produce but is also substantially less sensitive to temperature than such multivibrators of the past.

The multivibrator of the instant invention produces an exponential output waveform by integrating the collector current from a controlled current source transistor in a capacitor. The collector current is proportional to the output voltage of a digital gate, which in turn is proportional to the sum of the input current and a current derived from the output voltage of the multivibrator. One of the input currents becomes negligible as the result of a very large resistance in its input branch. The digital gate works as an operational amplifier, putting out whatever output voltage is required to hold the voltage at its input at a constant value, via a feedback circuit. As a result thereof, the voltage across a resistor within the output line of the multivibrator and the current through it, are determined by the output voltage. This produces an output waveshape whose rate of increase is proportional to its instantaneous amplitude, which, by definition, is an exponential function of time.

It is therefore an object of this invention to provide a sweep multivibrator which produces an exponential waveshape output.

It is another object of this invention to provide an exponential sweep multivibrator which is capable of extremely high-speed operation.

It is still another object of this invention to provide an exponential sweep multivibrator which is virtually insensitive to temperature.

It is a further object of this invention to provide an exponential sweep multivibrator which is economical to produce, extremely reliable in operation and which utilizes conventional, currently available components that lend themselves to standard mass producing manufacturing techniques.

For a better understanding of the present invention together with other and further objects thereof reference is made to the following description taken in conjunction with the accompanying drawing and its scope will be pointed out in the appended claims.

DETAILED DESCRIPTION OF THE PREFERRED EMBODIMENTS

Figure 1:
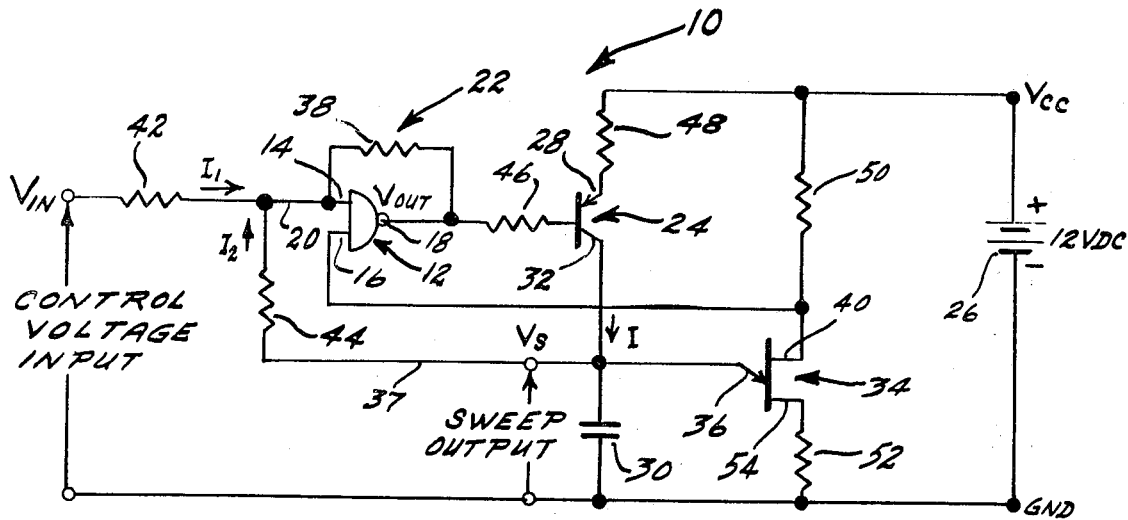
FIG. 1 is a schematic representation of one embodiment of the exponential sweep multivibrator of this invention.

The voltage-controlled exponential sweep multivibrator 10 of the instant invention is schematically illustrated in FIG. 1 of the drawing. Multivibrator 10 incorporates therein a digital device such as a NAND gate 12 having inputs 14 and 16 and output 18. A control voltage from any suitable source passes through an input line 20 to input 14 of NAND gate 12 while a feedback circuit 22 electrically connects first input 14 to NAND gate output 18. A transistor 24 converts the digital output 18 into a current. Any conventional DC source 26 is electrically connected to the emitter 28 of transistor 24 while a capacitor 30 is electrically connected to the collector 32 of transistor 24. A unijunction transistor 34 is electrically connected between capacitor 30 and input 16 of NAND gate 12. In addition, it is essential in this invention that the emitter 36 of transistor 34 be electrically connected to input line 20 via line 37.

The NAND gate 12 of the type used in this invention is commonly available in "logic" families such as resistor transistor logic (RTL), transistor transistor logic (TTL) and complementary metal-oxide-semiconductor (CMOS). In addition to the digital gate or NAND gate 12, the connection of feedback circuit 22 including a resistor 38 from the output 18 of NAND gate 12 to one of its inputs 14 forces the device into a linear mode of operation as long as the other input 16 is held at a logical "high" in a manner to be described in detail hereinbelow.

It should be noted, however, that the circuit components shown in FIG. 1 represent only one possible version of this invention since, for example, a reversed-polarity version of the instant invention could be assembled using a NOR gate for NAND gate 12, an NPN transistor for transistor 24 and a complementary UJT.

Still referring to FIG. 1, for a proper understanding of multivibrator 10, it is to be assumed that during operation thereof UJT 34 is to be OFF or nonconducting. Therefore, the voltage at its base 2, 40, is at a logical HIGH, which is fed into input 16 of digital NAND gate 12. The table set forth hereinbelow represents a normal operation of a digital device such as NAND gate 12:

| INPUT 14 | INPUT 16 | OUTPUT 18 |
| --- | --- | --- |
| HIGH | HIGH | LOW |
| LOW | HIGH | HIGH |
| HIGH | LOW | HIGH |
| LOW | LOW | HIGH |

Note that as long as input 16 is HIGH, the output state is the opposite of input 14, whereas when input 16 goes LOW, output 18 is always HIGH no matter what input 14 does.

Assuming, as above, that input 16 is HIGH, the existence of a feedback circuit or path 22 from output 18 to input 14 forces NAND gate 12 to depart from normal digital circuit behavior. If the feedback path 22 is provided via resistor 38 as shown, then NAND gate 12 performs similarly to a linear operational amplifier. If the control voltage input is V*in*, and the sweep output voltage is V*s*, then the output voltage of NAND gate 12, V out, is given approximately by $$V_{out} - (V_{cc}/2) = - R38/R42 \ (V_{in} - (V_{cc}/2)) - (R38/R44(V_s - (V_{cc}/2))) \quad \text{(Eq 1)}$$

Resistors 46 and 48, and transistor 24, form a linear voltage-to-current converter. The function performed by transistor 24 could be performed by other devices, such as a field-effect transistor. The main purpose of resistor 48 is to "swamp out" nonlinear effects in the base-emitter junction 28 of transistor 24, while the main purpose of resistor 46 is to set the proportionality factor K for voltage-to-current conversion. The current $I$ at collector 32 of transistor 24 is given approximately by:

$$I = K \ (V_{cc} - V_{out}) \quad \text{(Eq 2)}$$

Since UJT 34 is assumed nonconducting, all the current $I$ from the collector 32 of transistor 24 goes into capacitor 30 and charges it. The voltage across capacitor 30, the sweep output voltage, V*s*, is proportional to the time integral of the charging current of capacitor 30, which in turn is related to the control voltage input, V*in*, and sweep output voltage, V*s*, as shown by Eq 1. The result is that the charging rate of capacitor 30 can be set, anywhere over a very wide range, by adjustment of V*in*. However, as a result thereof, the output waveform is an exponential function of time.

Under the bias conditions established by the values of V*cc*, resistors 50 and 52, UJT 34 will switch to a conducting or ON state when the voltage at its emitter 36, in this circuit, the sweep output voltage, V*s*, reaches some specific value called V*p*. When this happens, UJT 34 becomes practically a short circuit from emitter 36 to base 1, 54, and also from base 2, 40, to base 1, 54. The voltage at 40 therefore drops to a logical LOW. UJT 34 remains in this state as long as the current entering its emitter 36 is greater than a minimum value called I*v*, the "latching" current. When the current entering emitter 36 becomes less than I*v*, UJT 34 switches OFF, the emitter current drops abruptly to almost zero, and the base 2 voltage at 40 returns to a logical HIGH.

When the sweep output voltage reaches V*p*, UJT 34 turns ON and the base 2 voltage at 40 drops to a logical LOW. Referring to the table set forth above, this LOW applied to input 16 causes the output at NAND gate 12 to (almost) instantly become HIGH, so that Eq 1 no longer applies. This HIGH output means Vout practically equals V*cc*, the positive power supply voltage, so $I$ becomes essentially zero by Eq 2. The only source of current at the emitter 36 of UJT 34 is now the stored charge in capacitor 30, which discharges very rapidly through UJT 34 and resistor 52. When the discharge current at capacitor 30 falls below I*v*, as described above, UJT 34 switches OFF. Its emitter 36 stops conducting, while its base 2 voltage at 40 returns to a HIGH input for input 16 of NAND gate 12. NAND gate 12 returns to linear operation according to Eq 1, transistor 24 again feeds charging current to capacitor 30, and the same cycle begins over again.

As a result of the circuitry of the instant invention, the output waveshape of multivibrator 10 is an essentially exponential function of time, given by $$V_s(t) = a + bt + ce^{dt} \quad \text{(Eq 3)}$$

where $a$, $b$, $c$ and $d$ are proportionality constants determined by the circuit component values, $e$ is the base of the natural logarithms, and $t$ is time. This equation shows that the output waveform has a constant offset component, a linear component, and an external component.

Figure 2:
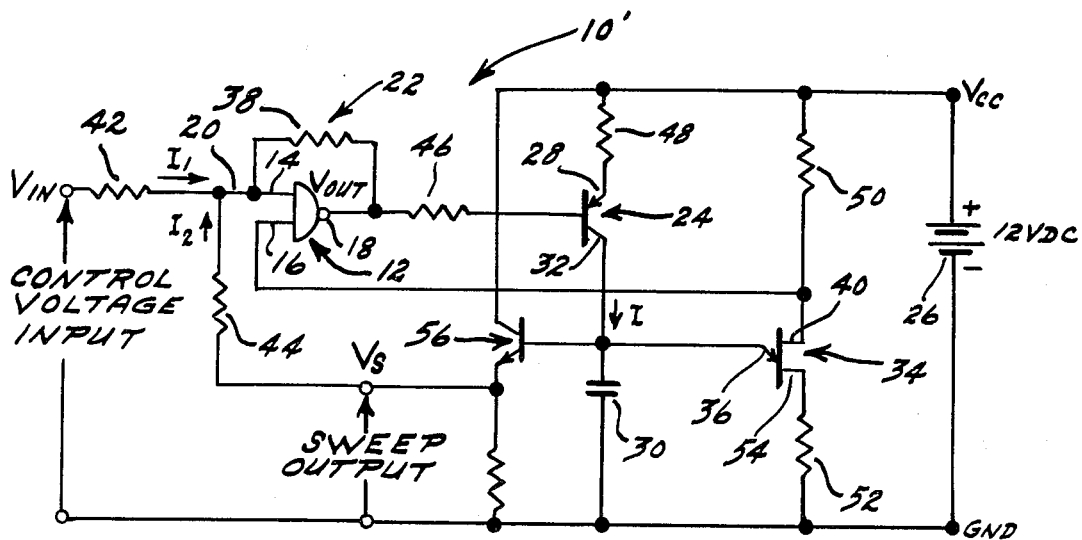
FIG. 2 is a schematic representation of another embodiment of the exponential sweep multivibrator of this invention.

The offset component is not very significant, since it can easily be compensated in practical designs. However, the offset component can be minimized by use of a small resistance for resistor 52, and can be further reduced by the use of an output buffer transistor 56 as shown in exponential sweep multivibrator 10' of FIG. 2.

The linear component can be minimized by choice of a large resistance for resistor 42. One might consider eliminating resistor 42 altogether from circuit 10, however, if a large resistance is used the deviation from an exponential waveform due to this source is negligible, while the ability to control the repetition rate via an external voltage is retained.

The exponential component is produced because:
a. an exponential function has at any instant in time a rate of increase equal to its amplitude, and
b. multivibrator 10 of this invention produces an output waveform by integrating the current $I$ from collector 32 of transistor 24 in capacitor 30. This current $I$ is proportional to the output voltage Vout of digital gate 12, which in turn is proportional to the sum of currents $I_1$ and $I_2$. Since as set forth hereinabove a very large value is chosen for resistance 42, current $I_1$ is negligible. As pointed out above, digital gate 12 operates as an operational amplifier, putting out whatever output voltage, Vout, required to hold the voltage at its input, Vin at a constant value, via feedback through resistor 38. Therefore, the voltage across resistor 44 and the current, $I_2$, through it, are determined by the sweep output voltage, $Vs$. This produces a sweep output waveshape which is an exponential function of time.

Although this invention has been described with reference to particular embodiments, it will be understood to those skilled in the art that this invention is also capable of a variety of further embodiments which encompass the essential features set forth above and being within the spirit and scope of the appended claims. For example, while the preferred component for digital gate 12 is a CMOS NAND gate such as ¼ of an RCA CD4011AE or Motorola MC14011CP, many other suitable digital gates could be substitued. Similarly, instead of the conventional unijunction transistor (UJT), 34, a programmable unijunction transistor (PUT) could be used. In addition a wide variety of junction and MOS field-effect transistors could be substituted for transistors 24 and 56.

I claim:

1. an exponential sweep multivibrator comprising a digital device having first and second inputs and an output, means electrically connected to said digital device for accepting a control voltage and directing said control voltage to said first input of said digital device, a feedback circuit electrically connected between said first input and said output of said digital device, means electrically connected to said output of said digital device for converting said digital device output voltage into a current, capacitor electrically connected to said voltage converting means, a DC source electrically connected to said voltage converting means, a voltage sensitive switching means, said switching means having at least two terminals, one of said terminals being electrically connected to said capacitor and said second input of said digital device and the other of said terminals being electrically connected to said first input of said digital device whereby said multivibrator is capable of producing an output waveshape which is an essentially exponential function with respect to time.

2. An exponential sweep multivibrator as defined in claim 1 further comprising a large resistance electrically connected between said control voltage accepting means and said digital device.

3. An exponential sweep multivibrator as defined in claim 1 wherein said digital device comprises a NAND gate.

4. An exponential sweep multivibrator as defined in claim 3 further comprising a large resistance electrically connected between said control voltage accepting means and said digital device.

5. An exponential sweep multivibrator as defined in claim 1 further comprising a small resistance electrically connected between said capacitor and said voltage sensitive switching means.

6. An exponential sweep multivibrator as defined in claim 5 further comprising a large resistance electrically connected between said control voltage accepting means and said digital device.

7. An exponential sweep multivibrator as defined in claim 6 wherein said digital device comprises a NAND gate.

8. An exponential sweep multivibrator as defined in claim 7 further comprising a buffer transistor electrically connected between said voltage sensitive switching means and said first input of said NAND gate.

9. An exponential sweep multivibrator as defined in claim 7 wherein said feedback circuit includes a resistor.

10. An exponential sweep multivibrator as defined in claim 9 wherein said voltage converting means comprises a transistor.

11. An exponential sweep multivibrator as defined in claim 10 wherein said voltage sensitive switching means comprises a unijunction transistor.

* * * * *